United States Patent
Ando et al.

(10) Patent No.: US 9,040,404 B2
(45) Date of Patent: May 26, 2015

(54) REPLACEMENT METAL GATE STRUCTURE FOR CMOS DEVICE

(71) Applicants: International Business Machines Corporation, Armonk, NY (US); GLOBAL FOUNDRIES Inc, Grand Cayman, KY (US)

(72) Inventors: Takashi Ando, Tuckahoe, NY (US); Kisik Choi, Hopewell Junction, NY (US); Srikanth B. Samavedam, Fishkill, NY (US)

(73) Assignees: International Business Machines Corporation, Armonk, NY (US); GlobalFoundries, Inc., Grand Cayman (KY)

( * ) Notice: Subject to any disclaimer, the term of this patent is extended or adjusted under 35 U.S.C. 154(b) by 121 days.

(21) Appl. No.: 13/676,483

(22) Filed: Nov. 14, 2012

(65) Prior Publication Data

US 2014/0131808 A1 May 15, 2014

(51) Int. Cl.
  *H01L 21/3205* (2006.01)
  *H01L 27/092* (2006.01)
  *H01L 21/8238* (2006.01)

(52) U.S. Cl.
  CPC ...... *H01L 27/092* (2013.01); *H01L 21/823842* (2013.01); *H01L 21/823857* (2013.01)

(58) Field of Classification Search
  USPC .......................................... 257/369; 438/595
  See application file for complete search history.

(56) References Cited

U.S. PATENT DOCUMENTS

| 7,045,406 B2 | 5/2006 | Huotari et al. |
| 7,473,637 B2 | 1/2009 | Kraus et al. |
| 7,807,525 B2 | 10/2010 | Doris et al. |
| 2007/0272967 A1 | 11/2007 | Pantisano et al. |
| 2008/0105920 A1 | 5/2008 | Hirano et al. |

OTHER PUBLICATIONS

Prosecution History of Related U.S. Appl. No. 13/676,575, Office Action mailed Jan. 17, 2014, all pages.
Prosecution History of Related U.S. Appl. No. 13/676,575, Amendment to Office Action mailed Jan. 17, 2014, Amendment dated Apr. 15, 2014, all pages.
B. H. Lee et al., "Gate stack technology for nanoscale devices," Materials Today, vol. 9, Issue 6, Jun. 2006, pp. 32-40.
C. L. Hinkle et al., "Interfacial oxygen and nitrogen induced dipole formation and vacancy passivation for increased effective work functions in TiN/HfO2 gate stacks," Applied Physics Letters, vol. 96, Issue 10, Mar. 2010, 103502, 3 pages.

(Continued)

*Primary Examiner* — Marvin Payen
(74) *Attorney, Agent, or Firm* — Yuamin Cai; Ira D. Blecker (57) ABSTRACT

A method of fabricating a replacement metal gate structure for a CMOS device. The method includes forming a dummy gate structure on an nFET portion and a pFET portion of the CMOS device; depositing an interlayer dielectric between the dummy gate structures; removing the dummy gate structures from the nFET portion and the pFET portion, resulting in a recess on the nFET portion and a recess on the pFET portion; depositing a first layer of titanium nitride into the recesses on the nFET portion and pFET portion; removing the first layer of titanium nitride from the nFET portion only; depositing a second layer of titanium nitride into the recesses on the nFET portion and pFET portion; depositing a gate metal onto the second layer of titanium nitride in the recesses on the nFET portion and pFET portion to fill the remainder of the recesses.

5 Claims, 7 Drawing Sheets

(56) References Cited

OTHER PUBLICATIONS

K. Tai et al., "High Performance pMOSFET with ALD-TiN/HfO2 Gate Stack on (110) Substrate by Low Temperature Process," Proceeding of the 36th European Solid-State Device Research Conference, ESSDERC 2006. Sep. 19-21, 2006, pp. 121-124.

C. F. Burham, "Development of an innovative fabrication method for n-MOS to p-MOS tunable single metal gate/high-k insulator devices for multiple threshold voltage," Ph.D. Thesis, The University of Texas at Austin, Dec. 2009. 109 pages.

K. Choi et al., "The effect of metal thickness, overlayer and high-k surface treatment on the effective work function of metal electrode," Proceedings of 35th European Solid-State Device Research Conference, ESSDERC 2005, Sep. 12-16, 2005, pp. 101-104.

Prosecutation History of Related U.S. Appl. 13/376,575, Notice of Allowance mailed Jul. 9, 2014, all pages.

Prosecution History of related U.S. Appl. No. 14/500,914, Notice of Allowance, mailed Jan. 27, 2015, all pages.

REPLACEMENT METAL GATE STRUCTURE FOR CMOS DEVICE

RELATED APPLICATION

This application is related to U.S. patent application Ser. No. 13/676,575 Feb. 20, 2015, entitled "REPLACEMENT METAL GATE STRUCTURE FOR CMOS DEVICE", filed even date herewith.

BACKGROUND

The exemplary embodiments relate to a manufacturing process for replacement metal gate CMOS devices and, more particularly, relate to a simpler manufacturing process to obtain quarter-gap pFET.

Today's integrated circuits include a vast number of devices. Smaller devices and shrinking ground rules are the key to enhance performance and to reduce cost. As FET (Field Effect Transistor) devices are being scaled down, the technology becomes more complex, and changes in device structures and new fabrication methods are needed to maintain the expected performance enhancement from one generation of devices to the next.

Device performance may be enhanced by the use of metal gates and high-k dielectric materials.

BRIEF SUMMARY

The various advantages and purposes of the exemplary embodiments as described above and hereafter are achieved by providing, according to a first aspect of the exemplary embodiments, a method of fabricating a replacement metal gate structure for a CMOS device on a semiconductor substrate. The method comprising: forming a high dielectric constant (high-k) dielectric on an nFET portion of the CMOS device and on a pFET portion of the CMOS device; forming a dummy gate structure on the high-k dielectric of the nFET portion of the CMOS device and on the high-k dielectric of the pFET portion of the CMOS device, each of the dummy gate structures comprising a layer of nitride, a layer of polysilicon or amorphous silicon and a nitride hard mask; forming spacers on the dummy gate structures; depositing an interlayer dielectric between the dummy gate structures; removing the dummy gate structures from the nFET portion and the pFET portion, resulting in a recess bounded by the spacers on the nFET portion and a recess bounded by the spacers on the pFET portion, the recesses having high-k dielectric on a bottom of each of the recesses; depositing a first layer of titanium nitride into the recesses in contact with the high-k dielectric on the nFET portion and pFET portion, the first layer of titanium nitride being present only on the high-k dielectric in the nFET portion and pFET portion; removing the first layer of titanium nitride from the nFET portion only to expose the high-k dielectric; depositing a second layer of titanium nitride into the recesses on the nFET portion and pFET portion, the second layer of titanium nitride being in direct contact with the high-k dielectric in the nFET portion and in direct contact with the first layer of titanium nitride in the pFET portion; depositing titanium aluminum onto the second layer of titanium nitride in the recesses on the nFET portion and pFET portion; and filling the remainder of the cavity on the nFET portion and pFET portion with a metal different from titanium aluminum.

According to a second aspect of the exemplary embodiments, there is provided a method of fabricating a replacement metal gate structure for a CMOS device on a semiconductor substrate. The method comprising: forming a high dielectric constant (high-k) dielectric on an nFET portion of the CMOS device and on a pFET portion of the CMOS device; forming a dummy gate structure on the high-k dielectric of the nFET portion of the CMOS device and on the high-k dielectric of the pFET portion of the CMOS device; depositing an interlayer dielectric between the dummy gate structures; removing the dummy gate structures from the nFET portion and the pFET portion, resulting in a recess on the nFET portion and a recess on the pFET portion, each of the recesses containing a high-k gate dielectric only on a bottom of each of the recesses; depositing a first layer of titanium nitride into the recesses on the nFET portion and pFET portion, the first layer of titanium nitride being present only on the high-k gate dielectric; removing the first layer of titanium nitride from the nFET portion only; depositing a second layer of titanium nitride into the recesses on the nFET portion and pFET portion, the second layer of titanium nitride being in direct contact with the high-k gate dielectric on the nFET portion and in direct contact with the first layer of titanium nitride on the pFET portion; and depositing a gate metal onto the second layer of titanium nitride in the recesses on the nFET portion and pFET portion and filling the remainder of the recesses on the nFET portion and pFET portion with the gate metal.

According to a third aspect of the exemplary embodiments, there is provided a CMOS device comprising: a semiconductor substrate having an nFET portion, a pFET portion and an interlayer dielectric between the nFET portion and pFET portion; the nFET portion having a gate structure, the gate structure comprising a recess filled with a high-k dielectric only on a bottom of the recess, a titanium nitride layer on the high-k dielectric and a gate metal filling the remainder of the recess; and the pFET portion having a gate structure, the gate structure comprising a recess filled with a high-k dielectric only on a bottom of the recess, a first titanium nitride layer on the high-k dielectric, a second titanium nitride layer on the first titanium nitride layer and a gate metal filling the remainder of the recess.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 11 illustrate a first method of the exemplary embodiments of forming a CMOS structure wherein:

FIGS. 12 and 13 illustrate a second method of the exemplary embodiments of forming a CMOS structure beginning with the structure shown in FIG. 9 wherein:

DETAILED DESCRIPTION

Typically, small FET devices with high-k dielectrics and metal gates require expensive complicated processing. It would be useful to find ways to simplify the fabrication process, while maintaining most of the performance benefits offered by such advanced structures. In addition, reduction of gate leakage current and improvement in thermal stability of nFET devices.

Referring to the Figures in more detail, and particularly referring to FIGS. 1 to 13, there is disclosed one or more methods for fabricating CMOS devices according to the exemplary embodiments.

Figure 1:
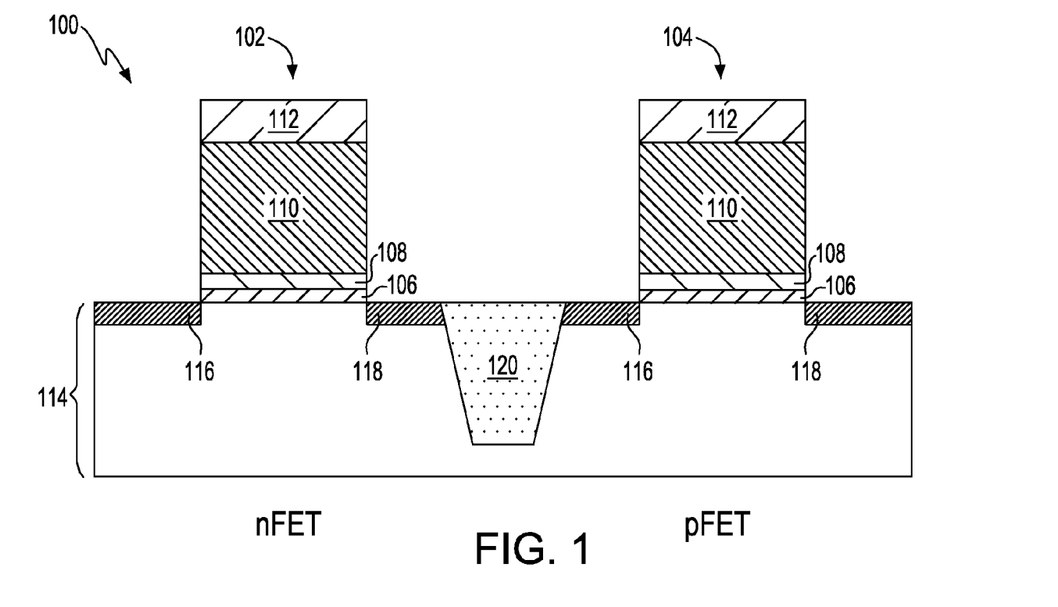
FIG. 1 illustrates dummy gate structures on nFET and pFET portions of a semiconductor substrate.

In FIG. 1, gate stack structures are formed which become dummy gate structures in a replacement gate process of the exemplary embodiments. Blanket layers of a gate dielectric, preferably a high dielectric constant ("high-k") dielectric material, titanium nitride, polysilicon (could also be amorphous silicon), and a nitride hard mask are deposited on a semiconductor substrate. Tantalum nitride may be used in place of the titanium nitride.

For purposes of illustration and not limitation, the gate dielectric may be $HfO_2$ and may be deposited by an atomic layer deposition (ALD) process or chemical vapor deposition (CVD) process to a thickness of about 2 nanometers (nm). The titanium nitride may be deposited by a physical vapor deposition (PVD) process or an ALD process to a thickness of about 2 nm. The polysilicon (or amorphous silicon) may be conventionally deposited to a thickness of about 100 nanometers (nm). The nitride hard mask, such as silicon nitride, may be conventionally deposited to a thickness of about 50 nm.

The various layers of gate dielectric, titanium nitride, polysilicon and nitride hard mask may be conventionally patterned by a reactive ion etching (RIE) process resulting in a semiconductor structure 100 including a gate structure 102 on an nFET portion of the semiconductor structure 100 and a gate structure 104 on a pFET portion of the semiconductor structure 100. Each of the gate structures 102, 104 includes a gate dielectric layer 106, a titanium nitride layer 108, a polysilicon (or amorphous silicon) layer 110 and a hard mask layer 112.

The semiconductor structure 100 further includes a semiconductor substrate 114 which may be a bulk semiconductor material or may be a semiconductor on insulator (SOI). The semiconductor material making up the semiconductor substrate may be a silicon material or any other semiconductor material.

Each of the gate structures 102, 104 may further include a source 116 and a drain 118 adjacent to the gate structures 102, 104 as is known in the art. Separating the nFET portion from the pFET portion may be an isolation region 120.

Figure 2:
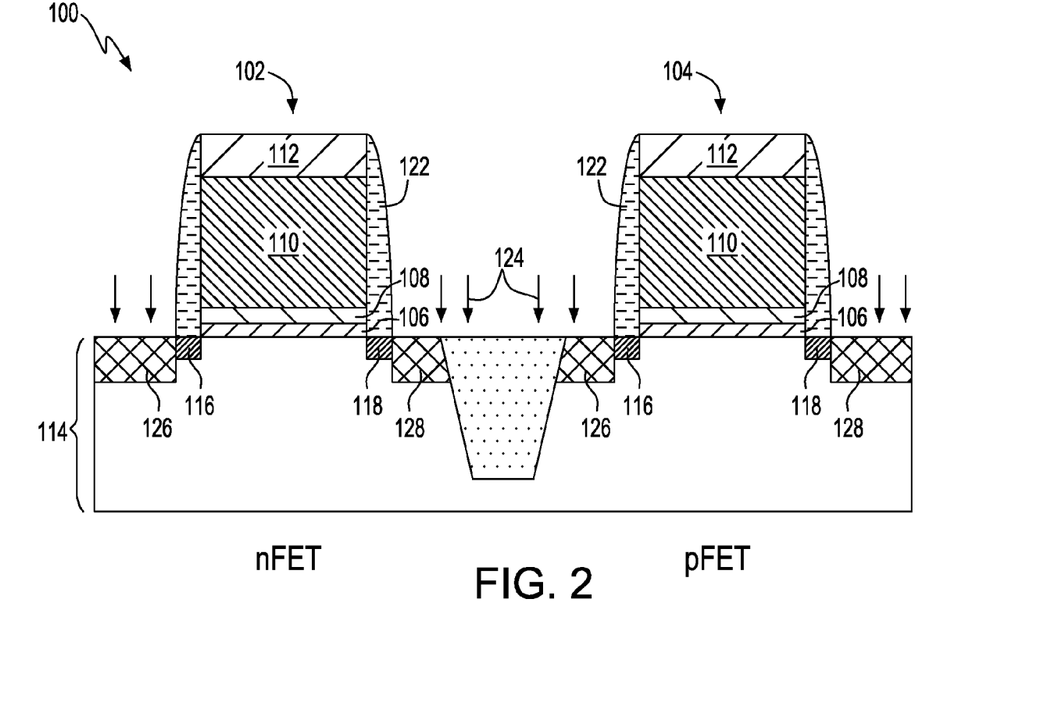
FIG. 2 illustrates forming spacers on the dummy gate structures.

Referring now to FIG. 2, spacers 122 have been conventionally formed on the nFET gate structure 102 and the pFET gate structure 104. Portions 126 of sources 116 not blocked by spacers 122 and portions 128 of drains 118 not blocked by spacers 122 may be ion implanted 124 followed by a dopant activation anneal.

Figure 3:
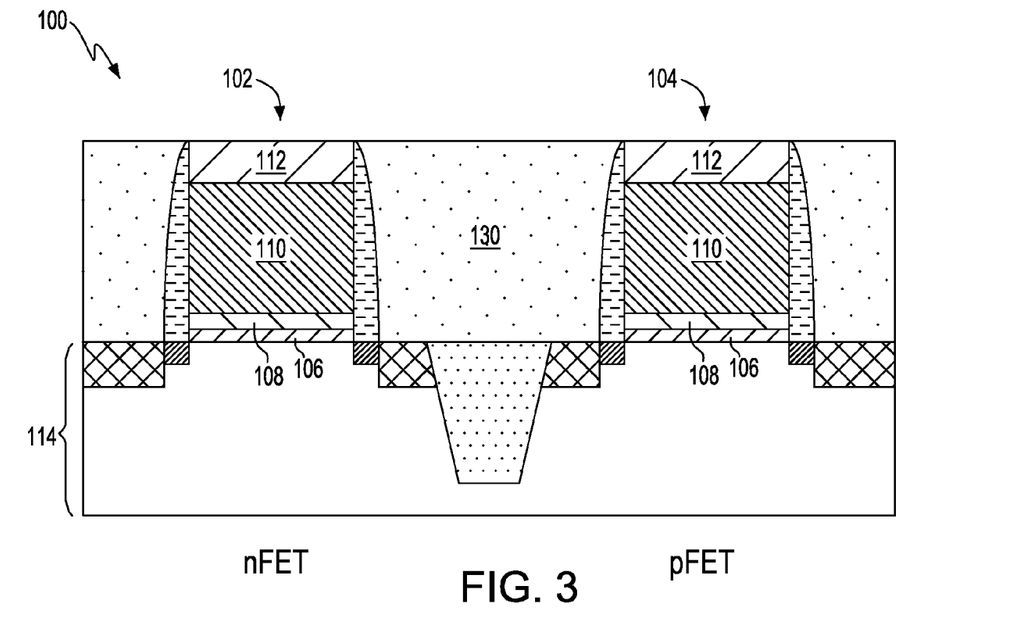
FIG. 3 illustrates forming an interlayer dielectric layer.

An interlayer dielectric (ILD) 130 may be deposited and planarized, stopping on the nitride hard mask 112 of the gate structures 102, 104 as shown in FIG. 3. The ILD may be any conventional ILD such as an oxide.

Figure 4:
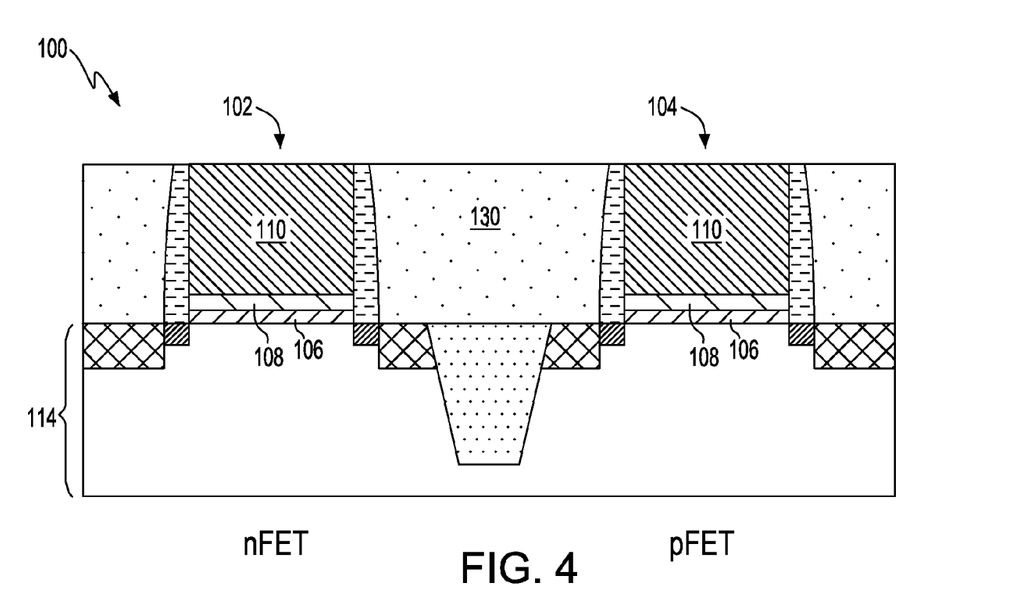
FIG. 4 illustrates planarizing to remove the hard nitride mask of the dummy gate structures.

The planarization process may continue to remove the nitride hard mask and expose the polysilicon 110 as shown in FIG. 4.

Figure 5:
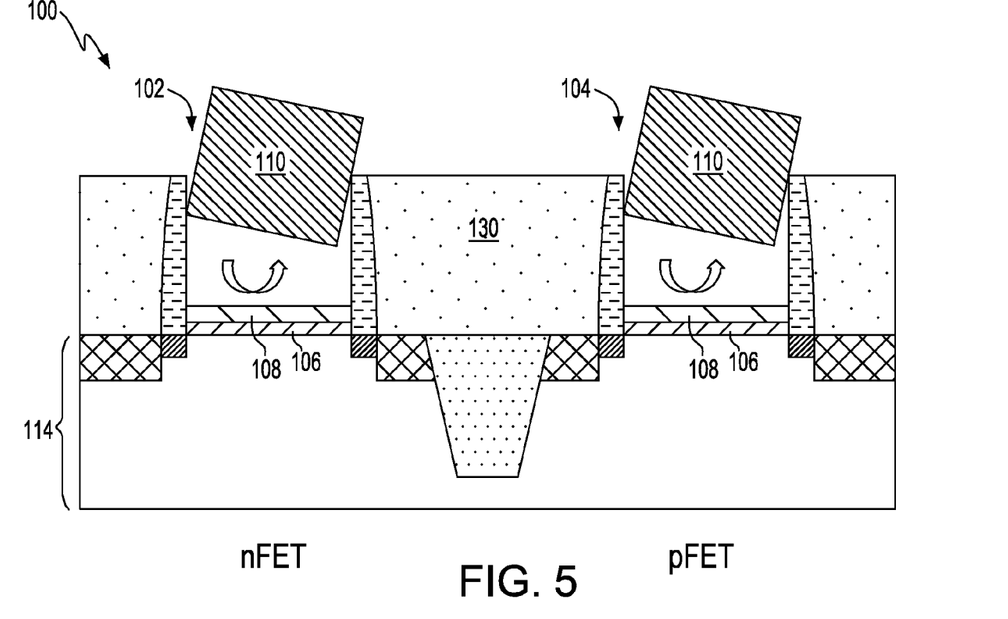
FIG. 5 illustrates removing the polysilicon (or amorphous silicon) of the dummy gate structures.

Referring now to FIG. 5, the polysilicon 110 may be removed from the gate structures 102, 104. The polysilicon 110 may be removed by a wet etching process such as tetramethylammonium hydroxide (TMAH), tetraethylammonium Hydroxide (TEAH) or ammonium hydroxide ($NH_4OH$). The polysilicon 110 may alternatively be removed by a combination of wet etching, using any of the foregoing etchants, and RIE. The polysilicon 110 is schematically illustrated in FIG. 5 as being removed in one piece for the purpose of illustration but it should be understood that the polysilicon 110 will actually be gradually removed upon continued exposure to the etchant.

Figure 6:
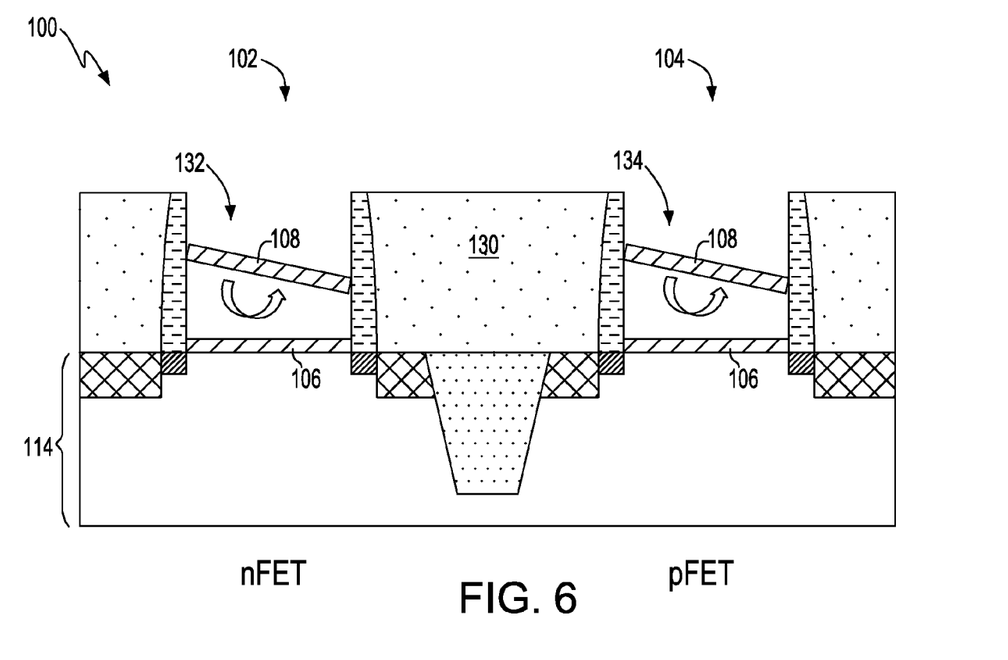
FIG. 6 illustrates removing the titanium nitride of the dummy gate structures.

Subsequently, as shown in FIG. 6, the titanium nitride layer 108 may be removed from the gate structures 102, 104 by a wet etching process that is selective to the $HfO_2$ gate dielectric. Suitable etchants may include a solution of hydrogen peroxide ($H_2O_2$), $NH_4OH$ and water or a solution of $H_2O_2$ and water. The titanium nitride layer 108 is schematically illustrated in FIG. 6 as being removed in one piece for the purpose of illustration but it should be understood that the titanium nitride layer 108 will actually be gradually removed upon continued exposure to the etchant. Once the titanium nitride layer 108 is removed from gate structures 102, 104, the only layer left from the original gate structures 102, 104 is gate dielectric 106. The recesses 132, 134 resulting from the removal of the titanium nitride layer 108, polysilicon layer 110 and hard nitride mask layer 112 will be filled with work function and metal gate materials to result in permanent gate structures 102, 104 in the nFET portion and pFET portion of the semiconductor structure 100. Recesses 132, 134 may also be called trenches.

Figure 7:
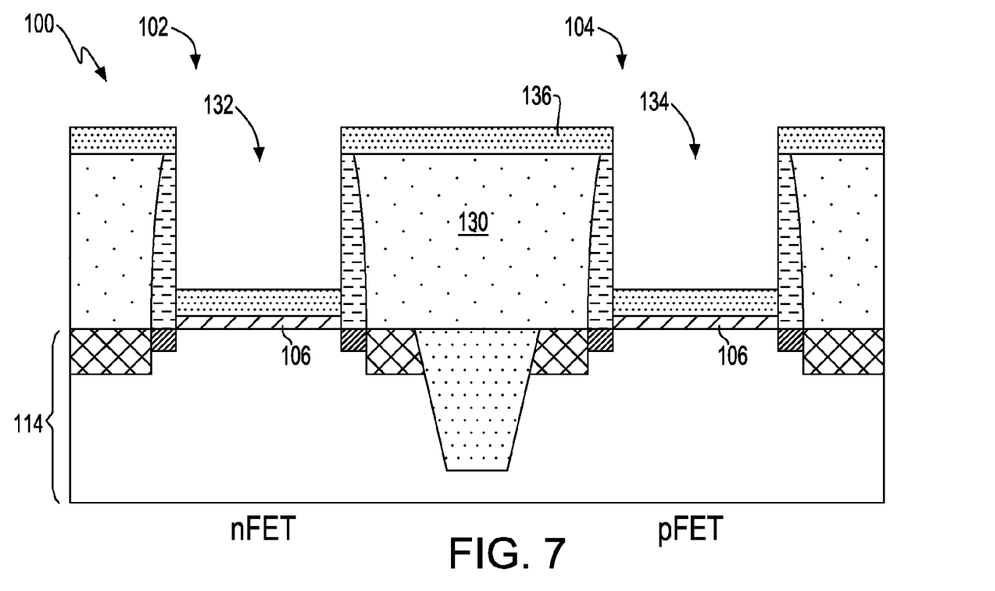
FIG. 7 illustrates depositing titanium nitride.

Referring now to FIG. 7, titanium nitride 136 may be deposited by a PVD, ALD or CVD process including within recesses 132, 134. Although not as preferred, tantalum nitride may be used in place of titanium nitride 136. The thickness of the titanium nitride may be about 5 nm. Oxygen vacancies in $HfO_2$ may be passivated by removing the dummy titanium nitride layer 108 (FIG. 6) and depositing the fresh titanium nitride layer 136.

Figure 8:
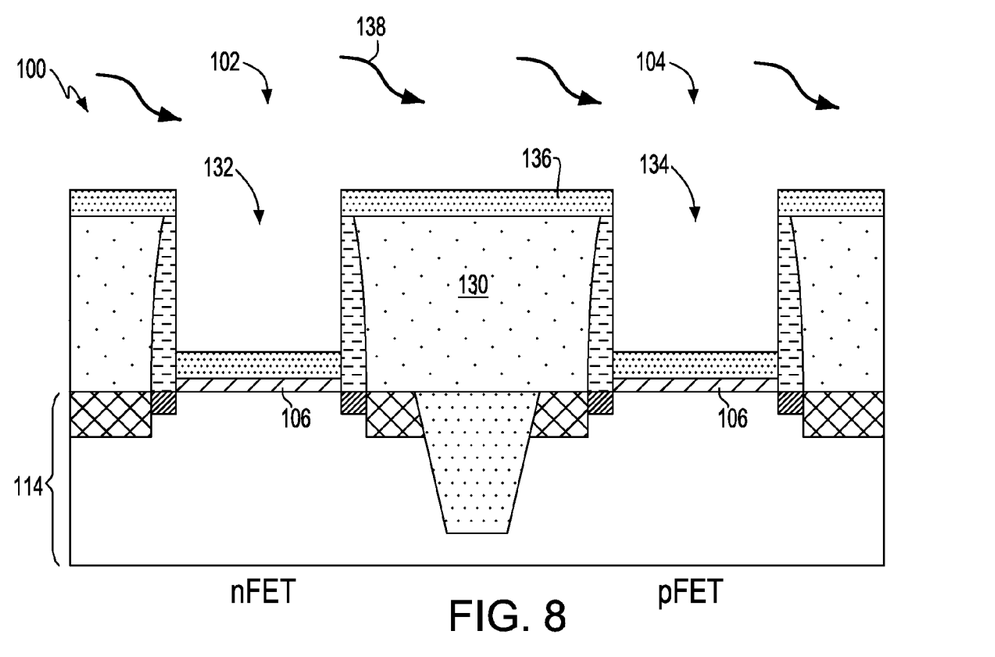
FIG. 8 illustrates an optional low temperature oxidation process.

It may be desirable to subject the semiconductor structure 100 to a low temperature oxidation step as indicated in FIG. 8. The low temperature oxidizing, indicated by arrows 138, may be at a temperature of about 400° C. for about 1 to 10 minutes in an oxidizing atmosphere. The low temperature oxidizing is an optional process step but may be useful to modify the titanium nitride to be titanium-rich.

Figure 9:
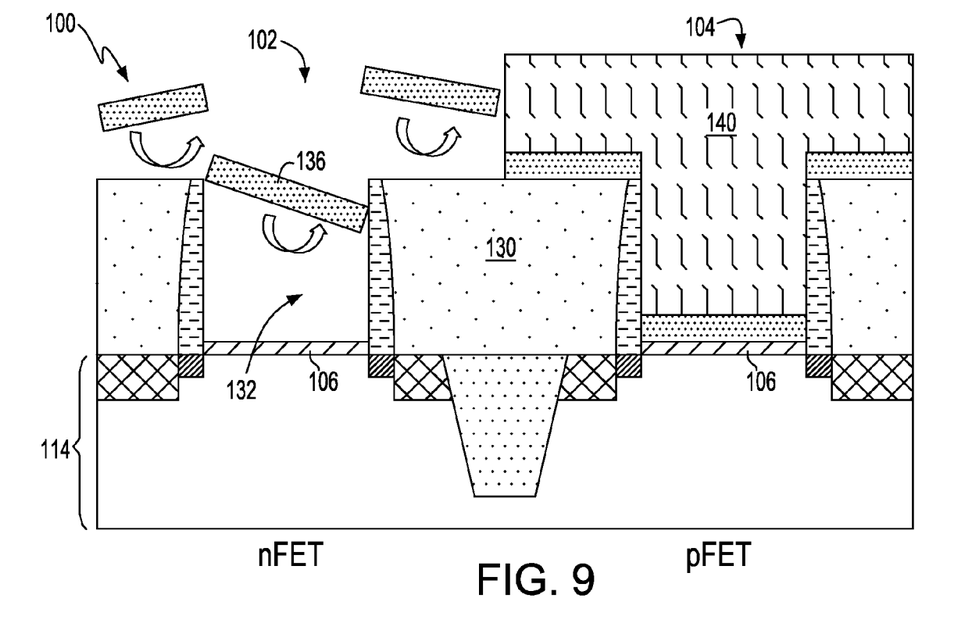
FIG. 9 illustrates removing the titanium nitride from the nFET portion only.

A photoresist mask 140 has been defined to block the pFET portion of the semiconductor structure 100. Thereafter, the titanium nitride 136 is removed from the nFET portion by an etchant selective to the $HfO_2$ gate dielectric as shown in FIG.

9. A suitable etchant for removing the titanium nitride 136 may be a solution of hydrogen peroxide ($H_2O_2$), $NH_4OH$ and water or a solution of $H_2O_2$ and water. Removal of the titanium nitride 136 includes removal from the recess 132 leaving only gate dielectric 106 within recess 132. The titanium nitride 136 is schematically illustrated in FIG. 9 as being removed in one piece for the purpose of illustration but it should be understood that the titanium nitride 136 will actually be gradually removed upon continued exposure to the etchant.

Figure 10:
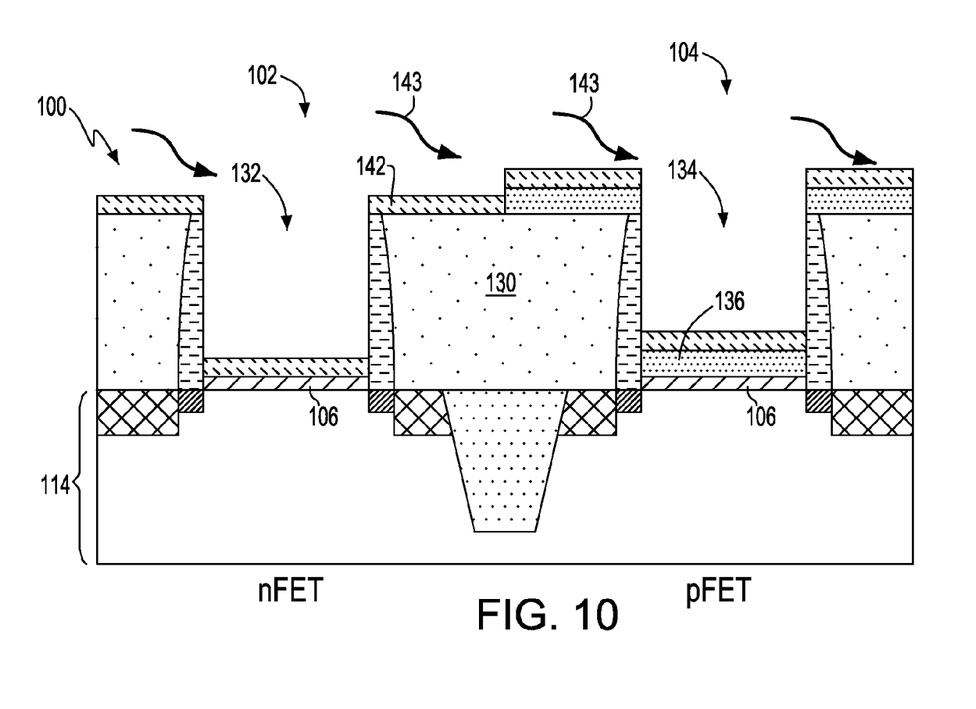
FIG. 10 illustrates a first process for depositing an additional layer of titanium nitride on both the nFET and pFET portions.

Referring now to FIG. 10, the photoresist mask 140 is conventionally stripped and then 2 to 3 nm thick layer of titanium-rich titanium nitride 142 is formed on the semiconductor structure 100. The titanium nitride 142 may be deposited by a PVD process wherein the proportions of titanium and nitrogen are adjusted so that titanium-rich titanium nitride 142 is deposited. Titanium-rich means that there is greater than 50 atomic percent titanium and less than 50 atomic percent nitrogen. The semiconductor structure 100 may then undergo an optional low temperature oxidation indicated by arrows 143 at 400° C. for 1 to 10 minutes.

Figure 11:
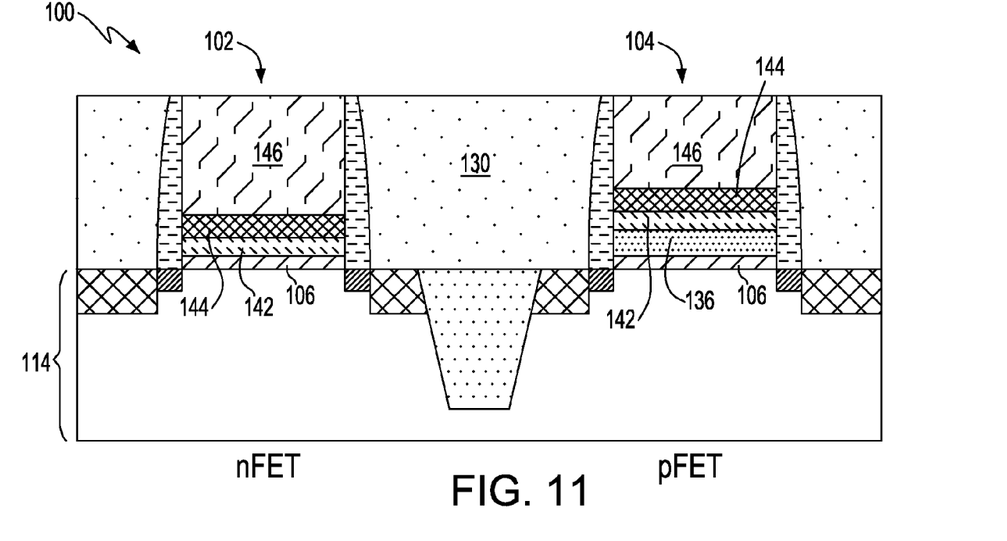
FIG. 11 illustrates deposition of titanium aluminum alloy and aluminum on both the nFET and pFET portions.

Thereafter, now referring to FIG. 11, a titanium aluminum alloy 144 may be deposited in the recesses 132, 134 in direct contact with the titanium-rich titanium nitride 142 followed by a metal 146 such as aluminum or tungsten to fill the remainder of the recesses 132, 134. The semiconductor structure 100 may then be conventionally planarized to remove any overburden of titanium nitride 142, titanium aluminum alloy 144 and aluminum 146. The titanium aluminum alloy 144 may be deposited by PVD or ALD to a thickness of about 3 nm. The aluminum or tungsten 146 may be deposited by PVD (for Al) and CVD (for W) to fill the remaining thickness of the recesses 132, 134.

Figure 12:
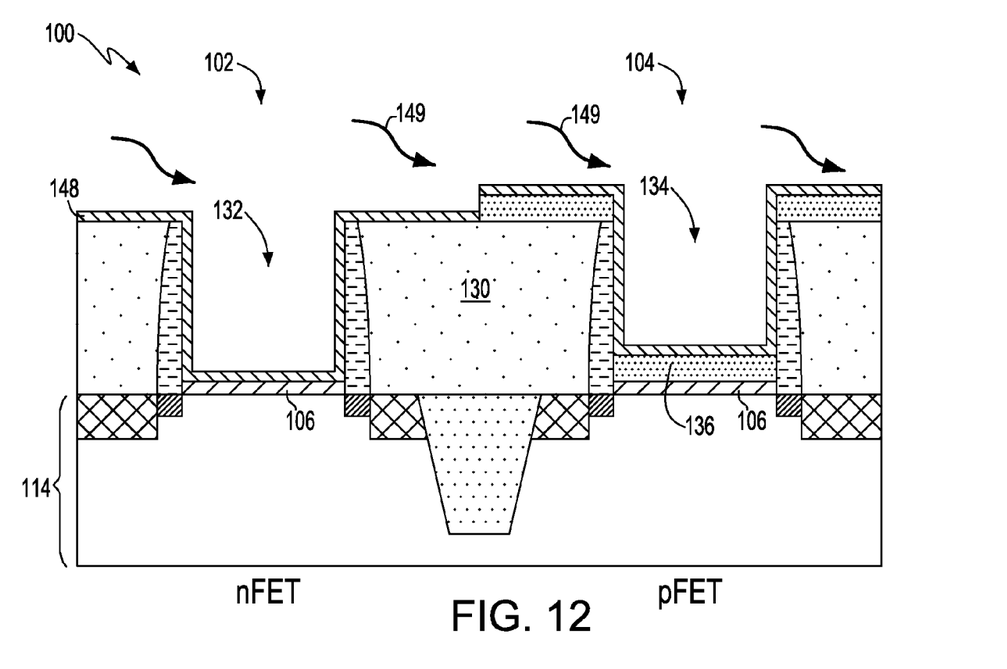
FIG. 12 illustrates a second process for depositing an additional layer of titanium nitride on both the nFET and pFET portions.
Figure 13:
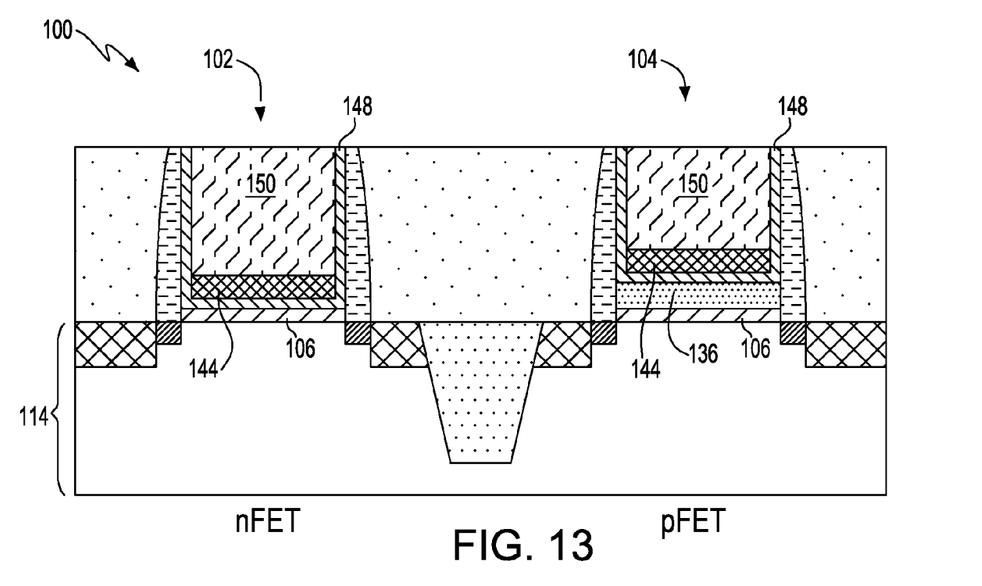
FIG. 13 illustrates deposition of titanium aluminum alloy and aluminum on both the nFET and pFET portions.

The last steps of the exemplary embodiments may be modified as illustrated in FIGS. 12 and 13. This alternative begins with the semiconductor structure 100 illustrated in FIG. 9. Then, referring to FIG. 12, the photoresist mask 140 is conventionally stripped and then 2 to 3 nm thick layer of titanium nitride 148 (about a 50/50 mixture based on atomic percent) is formed everywhere on the semiconductor structure 100'. The titanium nitride 148 lines the walls of the recesses 132, 134. The titanium nitride 148 may be conformally deposited by an ALD process. As-deposited ALD titanium nitride 148 may have a composition of about 50 atomic percent titanium and about 50 atomic percent nitrogen. The semiconductor structure 100' may then undergo a low temperature oxidation at 400° C. for 1 to 10 minutes indicated by arrows 149 to render the titanium nitride 148 titanium-rich when combined with the oxygen gettering effect of titanium aluminum in the downstream process. While not wishing to be held to any particular theory, it is believed that the low temperature oxidation causes some of the nitrogen to be replaced with oxygen to form a titanium oxynitride.

Thereafter, now referring to FIG. 13, a titanium aluminum alloy 144 may be deposited in the recesses 132, 134 in direct contact with the titanium-rich titanium nitride 148 followed by aluminum or tungsten 150 to fill the remainder of the recesses 132, 134. The semiconductor structure 100' may then be conventionally planarized to remove any overburden of titanium nitride 142, titanium aluminum alloy 144 and aluminum or tungsten 150.

The semiconductor structures 100, 100' may undergo additional processing such as back end of the line processing to form finished semiconductor structures.

Figure 14:
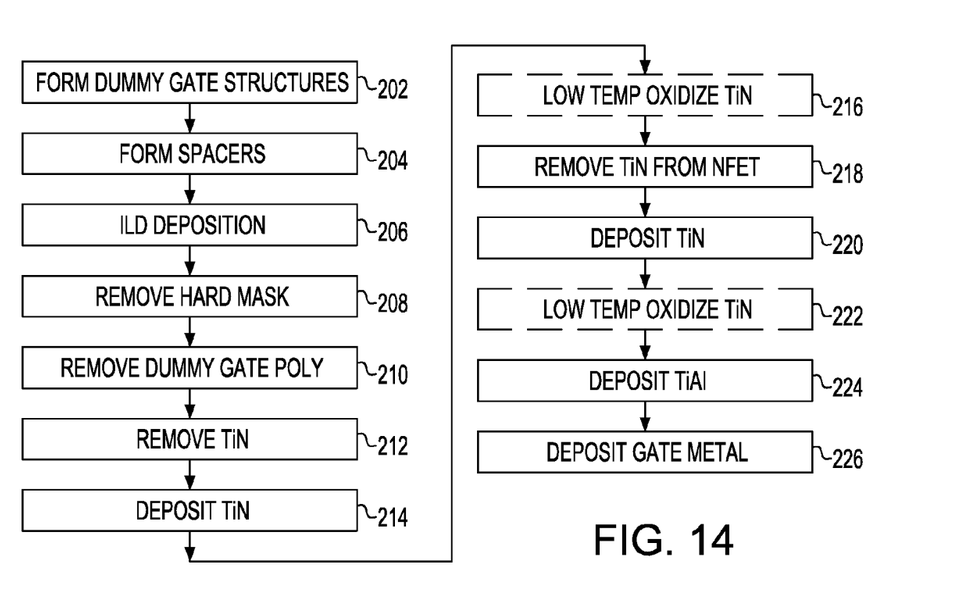
FIG. 14 is a flow chart illustrating the process flow of the exemplary embodiments.

A summary of the exemplary embodiments is illustrated in FIG. 14. In a first processing step, box 202, dummy gate structures are formed on nFET and pFET portions of a semiconductor substrate.

Thereafter, spacers may be formed on the dummy gate structures, box 204.

An ILD is deposited between the dummy gate structures and planarized, stopping on the dummy gate structures, box 206.

The hard nitride mask, gate polysilicon (or amorphous silicon) and titanium nitride of the dummy gate structures are removed, boxes 208, 210, 212, respectively, leaving recesses in the nFET and pFET portions.

A layer of titanium nitride is deposited in the recesses, box 214, and in an optional step, may undergo low temperature oxidation, box 216.

The layer of titanium nitride is then removed from the recess in the nFET portion only, box 218.

Another layer of titanium nitride may then be deposited in the recesses, box 220. This layer of titanium nitride may be titanium-rich as deposited or may need an optional low temperature oxidation, box 222, to become titanium-rich.

Then, additional metals are deposited to fill the recesses including titanium aluminum and then aluminum or tungsten, boxes 224 and 226 respectively.

Other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of fabricating a replacement metal gate structure for a CMOS device on a semiconductor substrate comprising:
    forming a high dielectric constant (high-k) dielectric on an nFET portion of the CMOS device and on a pFET portion of the CMOS device;
    forming a dummy gate structure on the high-k dielectric of the nFET portion of the CMOS device and on the high-k dielectric of the pFET portion of the CMOS device, each of the dummy gate structures comprising a layer of nitride, a layer of polysilicon or amorphous silicon and a nitride hard mask;
    forming spacers on the dummy gate structures;
    depositing an interlayer dielectric between the dummy gate structures;
    removing the dummy gate structures from the nFET portion and the pFET portion, resulting in a recess bounded by the spacers on the nFET portion and a recess bounded by the spacers on the pFET portion, the recesses having high-k dielectric only on a bottom of each of the recesses;
    depositing a first layer of titanium nitride into the recesses in contact with the high-k dielectric on the nFET portion and pFET portion, the first layer of titanium nitride being present only the high-k dielectric in the nFET portion and pFET portion;
    removing the first layer of titanium nitride from the nFET portion only to expose the high-k dielectric;
    depositing a second layer of titanium nitride into the recesses on the nFET portion and pFET portion, the second layer of titanium nitride being in direct contact with the high-k dielectric in the nFET portion and in direct contact with the first layer of titanium nitride in the pFET portion;

depositing titanium aluminum onto the second layer of titanium nitride in the recesses on the nFET portion and pFET portion; and filling the remainder of the cavity on the nFET portion and pFET portion with a metal different from titanium aluminum.

2. The method of claim 1 wherein the second layer of titanium nitride is titanium-rich such that the second layer of titanium nitride is greater than 50 atomic percent titanium.

3. The method of claim 1 wherein after depositing a first layer of titanium nitride further comprising oxidizing the first layer of titanium nitride at a temperature of 400° C. for 1 to 10 minutes.

4. The method of claim 1 wherein after depositing a second layer of titanium nitride further comprising oxidizing the second layer of titanium nitride at a temperature of 400° C. for 1 to 10 minutes.

5. The method of claim 1 wherein the metal different from titanium aluminum comprises aluminum or tungsten.

* * * * *